United States Patent [19]
Ohno

[11] Patent Number: 6,073,219
[45] Date of Patent: Jun. 6, 2000

[54] SEMICONDUCTOR MEMORY DEVICE WITH HIGH SPEED READ-MODIFY-WRITE FUNCTION

[75] Inventor: Kazuki Ohno, Tokyo, Japan

[73] Assignee: NEC Corporation, Tokyo, Japan

[21] Appl. No.: 08/908,517

[22] Filed: Aug. 7, 1997

[30] Foreign Application Priority Data

Aug. 9, 1996 [JP] Japan .................................. 8-210883

[51] Int. Cl.[7] .................................................. G06F 13/16
[52] U.S. Cl. .......................... 711/155; 711/168; 711/169
[58] Field of Search ............................ 365/189.04, 233, 365/189.05; 711/155, 168, 169

[56] References Cited

U.S. PATENT DOCUMENTS

| | | | |
|---|---|---|---|
| 4,941,088 | 7/1990 | Shaffer et al. | 711/121 |
| 5,235,693 | 8/1993 | Chinnaswamy et al. | 711/159 |
| 5,394,535 | 2/1995 | Ohuchi | 711/155 |
| 5,715,211 | 2/1998 | Toda | 365/233 |
| 5,729,711 | 3/1998 | Okamoto | 711/205 |
| 5,751,999 | 5/1998 | Suzuki | 711/167 |
| 5,802,579 | 9/1998 | Crary | 711/149 |
| 5,802,586 | 9/1998 | Jones et al. | 711/155 |
| 5,912,860 | 6/1999 | Schaefer | 365/233.5 |

FOREIGN PATENT DOCUMENTS

| | | |
|---|---|---|
| 59-154688 | 9/1984 | Japan . |
| 4-243085 | 8/1992 | Japan . |
| 7-182854 | 7/1995 | Japan . |
| 7-282583 | 10/1995 | Japan . |

OTHER PUBLICATIONS

1992 DRAM DataBook, Micron Technology, Rev. Dec. 1995, pp. 4–1 through 4–3.

*Primary Examiner*—Do Hyun Yoo
*Assistant Examiner*—Christopher S. Chow
*Attorney, Agent, or Firm*—Young & Thompson

[57] ABSTRACT

The present invention provides a synchronous semiconductor memory device, from which data are read out, and to which the data are written after having been modified and corrected, which comprises a read data bus for transmitting said read data and a write data bus for transmitting said written data. In the memory device, the second read-modify-write (RMW) cycle can start during the first RMW cycle so that the memory device can decrease a RMW time in a continuous RMW operation and also speed up the RMW operation.

4 Claims, 7 Drawing Sheets

SEMICONDUCTOR MEMORY DEVICE WITH HIGH SPEED READ-MODIFY-WRITE FUNCTION

BACKGROUND OF THE INVENTION

1. Field of the Invention

The present invention relates to a semiconductor memory device, and more particularly to a semiconductor memory device which performs a clock-synchronized read-modify-write (RMW) at high speed.

2. Description of the Prior Art

A synchronous semiconductor memory has been promoted for high speed input/output interface. This memory device, however, has a problem in not so high speed of the read-modify-write (RMW) which is important for graphic use. The read-modify-write (RMW) is such a function that after data have been read out from the memory, a graphics controller or a CPU modifies and corrects for subsequent rewriting operation of the modified and corrected data. The read-modify-write (RMW) is used for the purposes of reversing the color, blinking the pattern of image, both on a CRT display, and so on.

Figure 1:
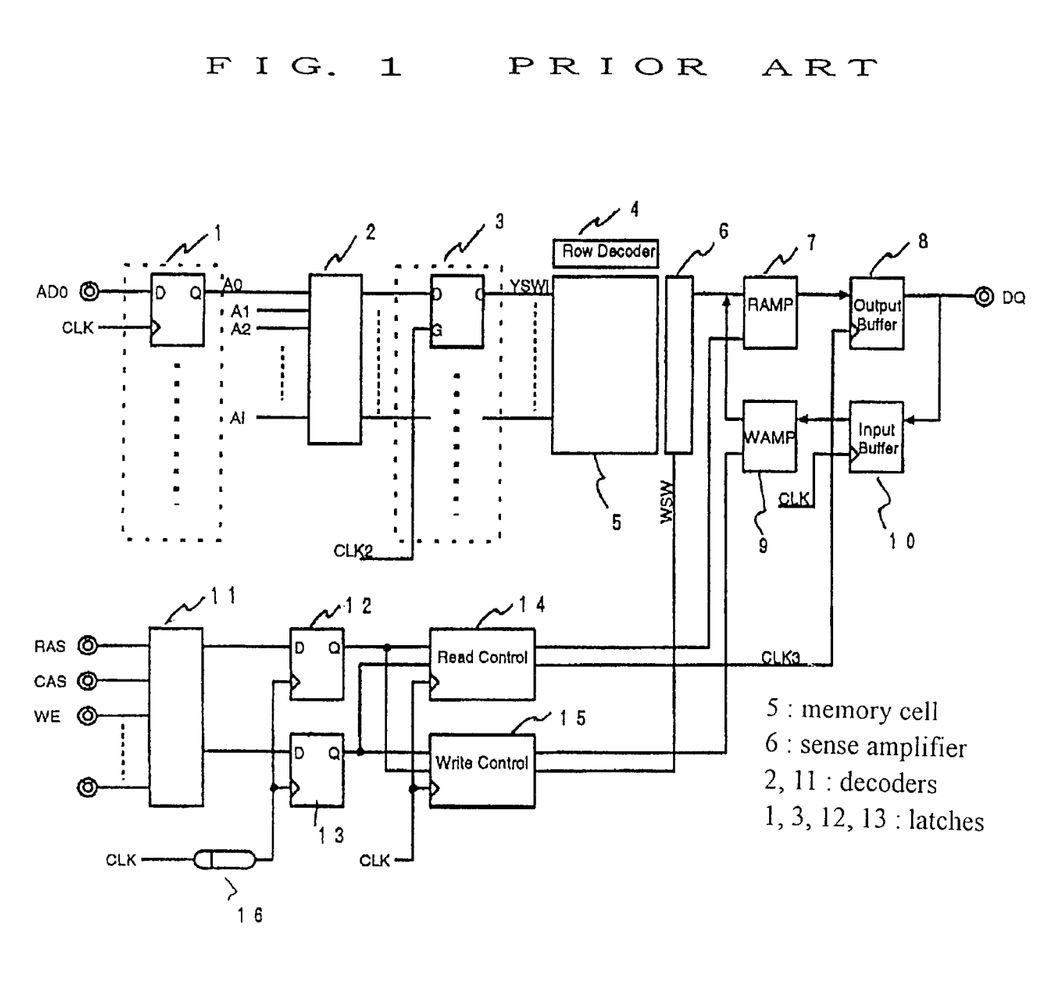
FIG. 1 is a circuit diagram illustrative of conventional synchronous semiconductor memory.

FIG. 1 is a circuit diagram illustrative of a conventional synchronous semiconductor memory. In FIG. 1, a circuitry has a flip-flop 1 which latches address signals synchronizing with set-up timing of a first clock CLK. These address signals are inputted to an address decoding circuit 2 for decoding the address signals. The decoded address signals are then inputted to a latch circuit 3 which latches the signals at timing of a second clock CLK2. The latch circuit 3 outputs column selecting signals YSWs.

On the contrary, control signals such as RAS, CAS, WE, etc. are decoded in a decoding circuit 11, where RAS means row address strobe signal, CAS means column address strobe signal, and We means for write enable signal. The signals outputted from the decoding circuit 11 are thereafter latched with a read command circuit 12 and with a write command circuit 13 at timing of a delayed first clock CLK which has been delayed by a time for decoding the signals in a delay circuit 16.

Upon input of a read command supplied from the read command circuit 12, the read control circuit 14 makes a read amplifier 7 amplify the data outputted from a sensing amplifier 6 selected by the column selecting signals YSWs. The data amplified with the read amplifier 7 is outputted to an input/output pin DQ at set-up timing of a third clock CLK3 outputted from the read control circuit 14. At the same time, for stopping a write command a signal has inputted to a write control circuit 15.

In a write operation, a write control circuit 15 controls a write amplifier 9 and a write switch (WSW) for write-operation of data inputted by an input buffer 10 when the first clock CLK is risen. At this time, a signal has been inputted to the read control circuit 14 to stop a read command.

The above description was made assuming that in the above mentioned read and write operation, a memory cell 5 holds data on a word line selected with a row decoder 4, where the data have been amplified by the sensing amplifier 6, similarly to that of the conventional DRAMs.

Figure 2:
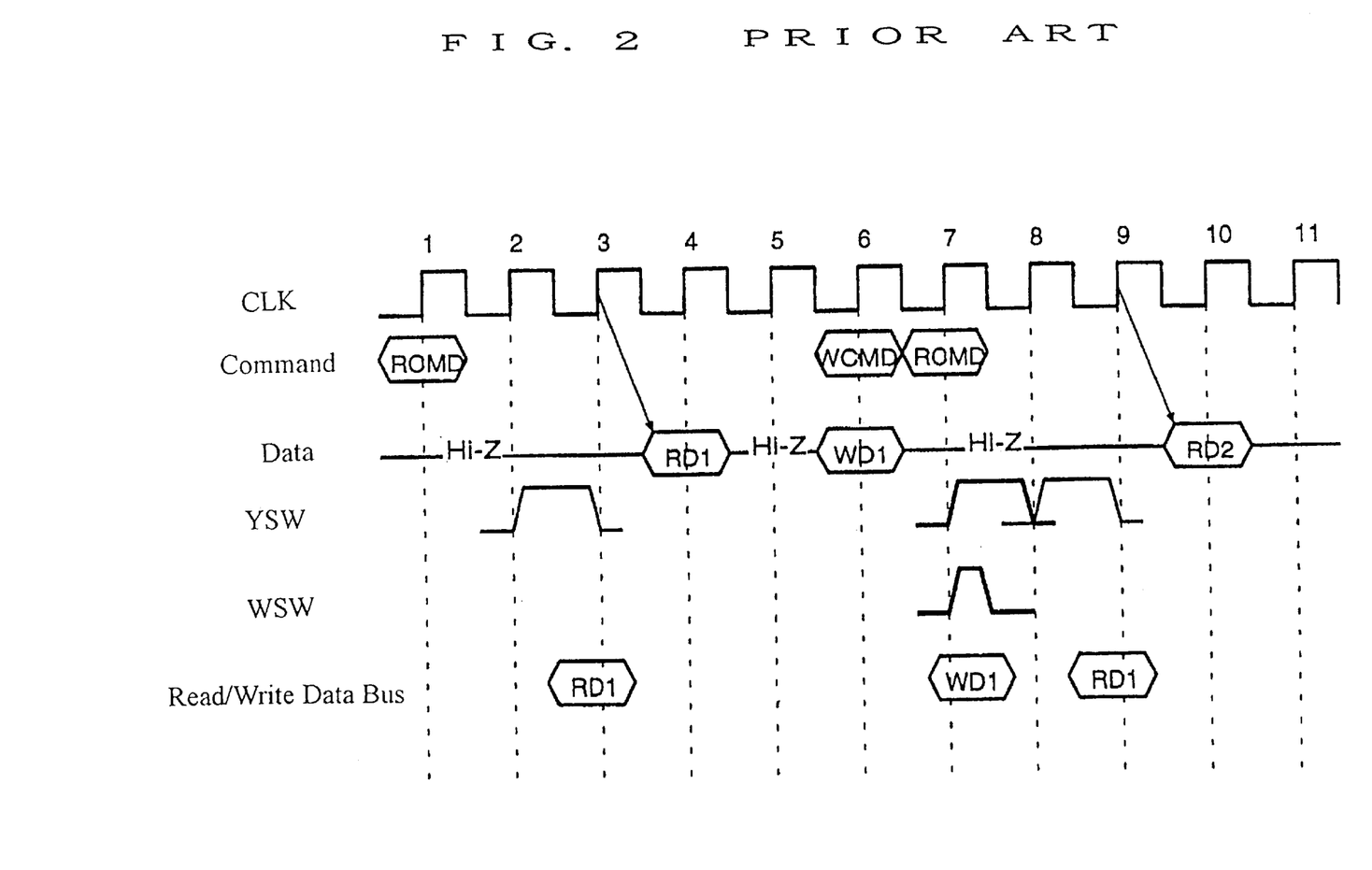
FIG. 2 is a timing chart of the conventional synchronous semiconductor memory as shown in FIG. 1.

FIG. 2 is a timing chart illustrative of operations the conventional synchronous semiconductor memory as shown in FIG. 1. In FIG. 2, the read and write command are inputted at set-up timing of the first clock CLK. A read command (RCMD) is inputted at the timing of the clock No.1. After the read command has been inputted, data are read out at the set-up timing of a column selecting signal (YSW), similarly to that of conventional DRAMs.

The read out data are then outputted as the read-data RD1 at the timing of the clock No.3. The time duration defined between the clock No.1 and the clock No.3 means that the CAS latency equals three (CL=3) as shown in FIG. 2. The current technology demands operation at CL=3 under condition of 100 M Hz frequency, or 10 nsec clock cycle. If, however, the CAS latency is set at one, or CL=1, then the maximum operation frequency will be 33 Mhz. This low operation frequency causes a poor performance of the memory device. It is, therefore, the best choice that the CAS latency is set at three (CL=3) as shown in FIG. 2.

The read-data RD1 is supplied into the controller such as a graphics controller, a CPU, etc. at the timing of the clock No.4 for rewriting the same after modified and corrected. This rewrite process is made at the timing of the clock No.6 because the clock No.6 is the earliest timing capable of inputting the write command. Not withstanding, the clock No.5 is not suitable for the above purpose because of the necessity for setting the data bus in a high impedance state. This high impedance state of the data bus is set to avoid a collision between the memory driving signal and an external controller driving signal.

The memory stops driving the data bus for entry into the high impedance state after a predetermined time period has been passed from the clock No.4. If data writing is made at the timing of the clock No. 5, the controller has to drive the data bus before the clock No.5, because it is necessary to input a command and data for satisfying the setup time before the clock No. 5 is risen.

Actually, the above mentioned operation of stopping to drive the data bus is made in accordance with the specification of the memory device.

A data writing is made by a command inputted at the timing of the clock No.6. Namely this data writing is made during the time period when the column selecting signal (YSW) is set up and the write-switch signal (WSW) is in the HIGH level. Data are supplied through the data bus into the memory for a read-modify-write (RMW) operation, and the input of the next read command will be enabled at the timing of the clock No.7.

In the above mentioned synchronous semiconductor memory, a data bus commonly serves for both data writing and data reading. As a result, it is necessary to have the read command and the write command function exclusively to each other. Also it is necessary that the read command is inputted at the timing of the clock No.1, and data are supplied into an external controller, then the modified data are written at the timing of the clock No.6. Further it is necessary to conduct the next reading at the timing of the clock No.7.

As mentioned above, the conventional synchronous semiconductor memory has the synchronous interface which enables continuous reading and writing at higher speed than the normal DRAMs. However, a read-modify-write (RMW) speed is almost the same as the normal DRAMs. Namely, in a high speed page mode, the normal DRAM can conduct the read-modify-write (RMW), for example, in 60 nsec because of its capability of 30 nsec cycle read/write operation. The conventional synchronous semiconductor memory, however, needs 60 nsec for the read-modify-write (RMW), which is the same time as the normal DRAM, in spite of 10 nsec cycle operation.

The performance of the conventional synchronous semiconductor memory is the same as the normal DRAM which is operable in a high speed page mode. That is why the conventional synchronous semiconductor memory needs one dummy clock to avoid a signal collision in the data bus at the time of changing from read operation to write operation, even pipe-line operation is made for high speed clock cycle.

Figure 3:
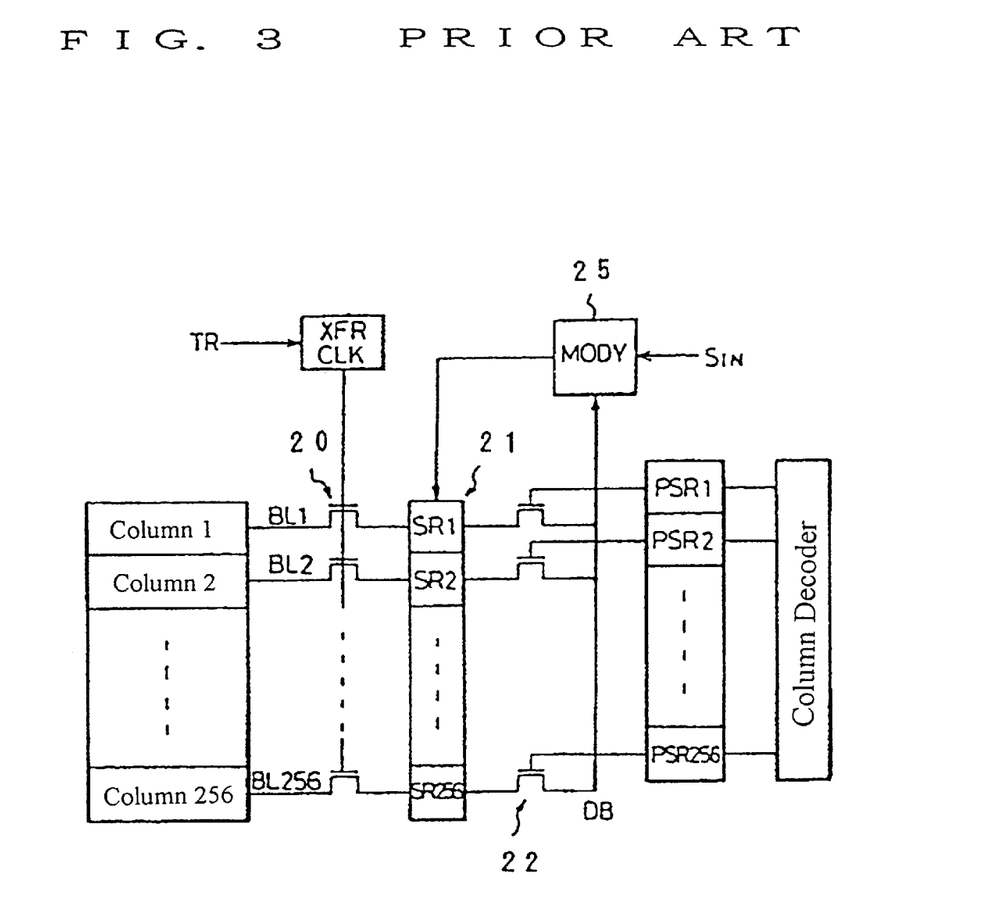
FIG. 3 is a block circuit diagram illustrative of a high speed RMW circuit according to the prior art.

To speed up a read-modify-write (RMW) was proposed in the Japanese Laid-open Patent Publication No.61-104391. The proposed technique is implemented by forming a circuitry which comprises the normal DRAM circuit and is a shift-register circuit operating in a synchronous with the former one. Since, however, only this circuitry cannot operate a read-modify-write (RMW) to a voluntary column address, the document proposes adding some circuits as shown in FIG. 3. In the circuitry shown in FIG. 3, a shift-register column 21 is provided through a transfer-gate column 20 connected to bit-line BL1–BL256 connected to columns 1–256. The shift-register column 21 outputs signals to a output-gate column 22. The drains of the transistors as elements of the output-gate column 22 are connected to a data bus DB. This data bus DB is connected to a modification circuit 25.

The technique proposed in the document can increase the speed of a read-modify-write (RMW) operation. However, the prior art needs shift-registers in addition to the memory cells of the normal DRAMs as mentioned above. Consequently, the prior art merely provides the memory device like the conventional VRAM which consists of a dual-port-memory. As a result, it is led to a problems in increase of the memory-chip-size and in a high manufacturing cost.

SUMMARY OF THE INVENTION

Accordingly, it is an object of the present invention to provide a semiconductor memory device which performs a clock-synchronized read-modify-write (RMW) at high speed.

It is a further object of the present invention to provide a semiconductor memory device which can increase the speed of a read-modify-write (RMW) using only simple circuitry.

It is a still further object of the present invention to provide a semiconductor memory device which can increase the speed of a read-modify-write (RMW), with a chip-size reduction and a fabrication cost-down.

The present invention provides a novel synchronous semiconductor memory device, from which data are read out, and to which data are written after modified and corrected wherein the memory device has a read data bus through which said read data are transmitted and a write data bus through which said written data are transmitted.

In the synchronous semiconductor memory device, the second read-modify-write (RMW) cycle can starts during the first RMW cycle. The memory device has an advantage of decreasing a RMW time in continuous RMW operations to increase the speed of the RMW operation.

BRIEF DESCRIPTION OF THE INVENTION

Preferred embodiments of the present invention will be described in detail with reference to the accompanying drawings.

DESCRIPTION OF THE PREFERRED EMBODIMENTS

Figure 4:
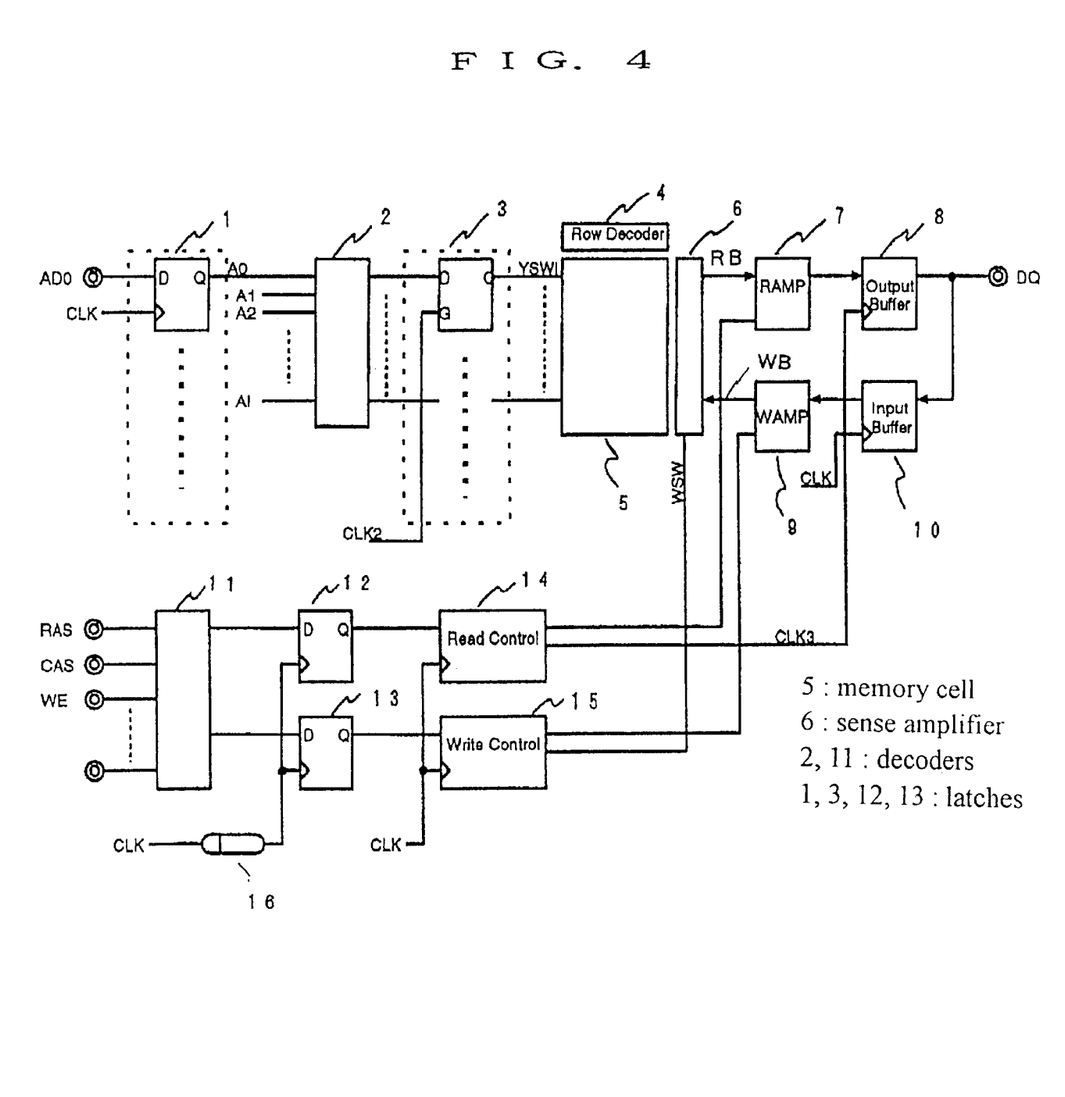
FIG. 4 is a block circuit diagram illustrative of a synchronous semiconductor memory according to the present invention.

An embodiment according to the present invention will be described with reference to the accompanying drawings. FIG. 3 is a circuit diagram illustrative of a synchronous semiconductor memory according to the present invention. In FIG. 4, a circuitry has a flip-flop 1 for latching address signals, an address decoding circuit 2 for decoding the address signals latched with the flip-flop 1, a latch circuit 3 for latching the signals at the timing of the second clock CLK2, a row decoder 4, a memory cell 5, a sensing amplifier 6, a read amplifier 7, an output buffer 8, a write amplifier 9, and an input buffer 10.

To control the above mentioned elements, the circuitry also has a decoding circuit 11 which decodes control signals such as RAS, CAS, WE, etc. where RAS means a row address strobe signal, CAS means a column address strobe signal, and WE means a write enable signal.

The circuitry further has a read command latch circuit 12 and a write command latch circuit 13. Each of the latch circuit 12 and 13 latches signals outputted from the decoding circuit 11. The circuitry further has a read control circuit 14, a write control circuit 15, and a delay circuit 16.

As shown in FIG. 4, the memory device according to the present invention has a read data bus RB and a write data bus WB. The sensing amplifier 6 outputs data to the read amplifier 7 through the read data bus RB, and the write amplifier 9 outputs data to the sensing amplifier 6 through the write data bus WB independently so that the memory device can conduct parallel reading and a writing operation.

In FIG. 4, address signals are latched with the flip-flop 1, synchronizing with a set-up timing of the first clock CLK. Address signals are decoded with the address decoding circuit 2. The decoded address signals are inputted to the latch circuit 3 for latching the signals at a timing of the second clock CLK2. The latch circuit 3 outputs column selecting signals YSWs.

On the other hand, control signals such as RAS, CAS, WE, etc. are decoded with the decoding circuit 11. The signals outputted from the decoding circuit 11 are latched with the read command circuit 12 and the write command circuit 13 at the timing of the delayed first clock CLK delayed by the decoding time in the delay circuit 16.

When a read command (RCMD) is inputted, data are read out from the sensing amplifier 6 selected by the column selecting signal (YSW) which has been outputted from the read control circuit 14. The data is amplified with the read amplifier 7, and outputted to the input/output pin DQ at the setup timing of the third clock CLK3 which has been outputted from the read control circuit 14.

For writing operation, data supplied at the set-up timing of the first clock CLK are written to the memory cell 5. This writing operation is conducted in accordance with the write control circuit 15 which controls the write amplifier 9 and outputs a write-switch-signal (WSW) to the sensing amplifier 6.

Figure 5:
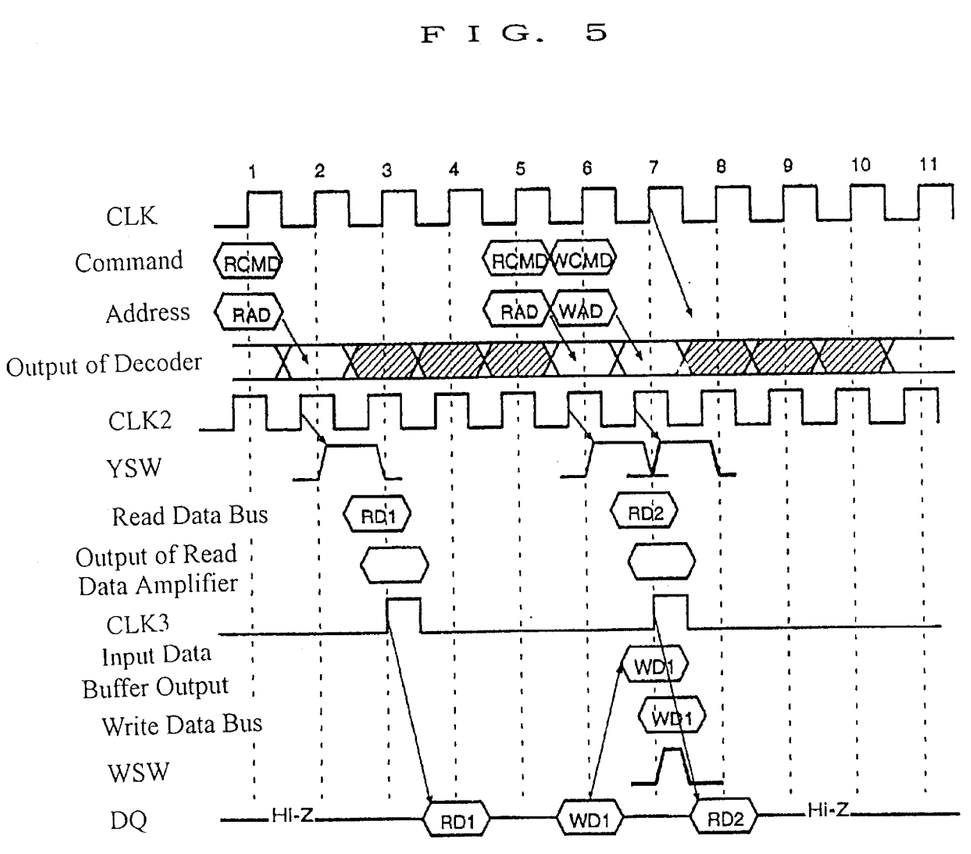
FIG. 5 is a timing chart of the synchronous semiconductor memory as shown in FIG. 4.

FIG. 5 is a timing chart of signals for the synchronous semiconductor memory as shown in FIG. 4. In FIG. 5, read and write commands are inputted at the set-up timing of the first clock CLK.1. At the clock No.1, a read command (RCMD) is inputted. After the read command has been inputted, data are read out at a set-up timing of the column selecting signal (YSW).

The read out data are transmitted to the read amplifier 7 through the read data bus RB, and then supplied to the input/out pin DQ as read data RD1 at the timing of the clock No.3 so that the data outputting timing is determined wherein the CAS latency equals three (CL=3) in this embodiment. The state-of-the-art technology demands operations at CL=3 under 100 MHz frequency, or in 10 nsec clock cycle. If, however, the CAS latency is set one or CL=1, then the maximum operation frequency will be 33 MHz. This low operation frequency causes a poor performance of the memory device. Therefor, it is the best way that the CAS latency is set three (CL=3) as shown in FIG. 5.

The read-data RD1 is received by a controller such as a graphics controller, a CPU, etc. at the timing of the clock No.4 for modification and correction to carry out a subsequent rewrite operation.

This write operation is made by a write command (WCMD) inputted at the timing of the clock No.6. The writing is conducted during a time period when the column selecting signal (YSW) is set up and a write switch (WSW) signal is kept in HIGH state. Write-data is supplied from the write amplifier 9 to the sensing amplifier 6 through the write data bus WB. The writing operation is conducted at the timing of the clock No.6, for which reason the second reading is conducted during the first writing operation mentioned above. Namely, the second read command (RCMD) is inputted during the first read-modify-write (RMW) operation, so that the second read command (RCMD) is inputted at the timing of the clock No.5 as shown in FIG. 5.

When a read command (RCMD) is inputted at the timing of the clock No.5, a column selecting signal (YSW) is activated around the clock No.6. A write command (WCMD) inputted at the timing of the clock No.6 is activated around the clock No.7. There is a time difference between read and write commands activations resulting in no collision between reading and writing data.

No problem is thus risen that column selecting signals (YSW) are activated in succession.

The memory device according to the present embodiment separates the read data bus RB and the write data bus WB, so that the memory device can avoid a collision between reading and writing data without co-existence of both the data.

Figure 6:
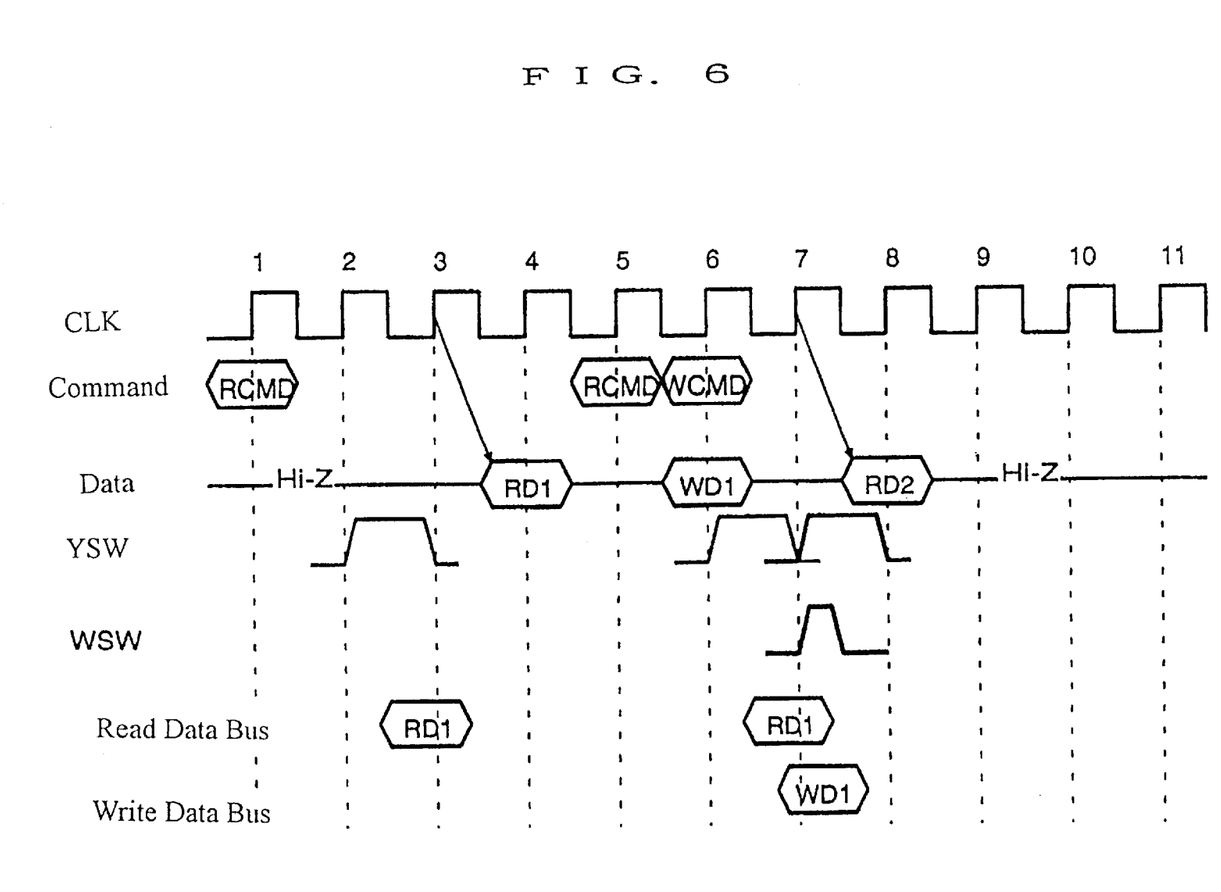
FIG. 6 is a timing chart which shows a timing of FIG. 4 with reference to the timing shown in FIG. 2.

FIG. 6 is a timing chart for the circuit shown in FIG. 4 with reference to the timing shown in FIG. 2. FIG. 6 shows that the memory device according to the present embodiment can operate reading and writing simultaneously as having the read data bus RB and the write data bus WB independently.

Figure 7:
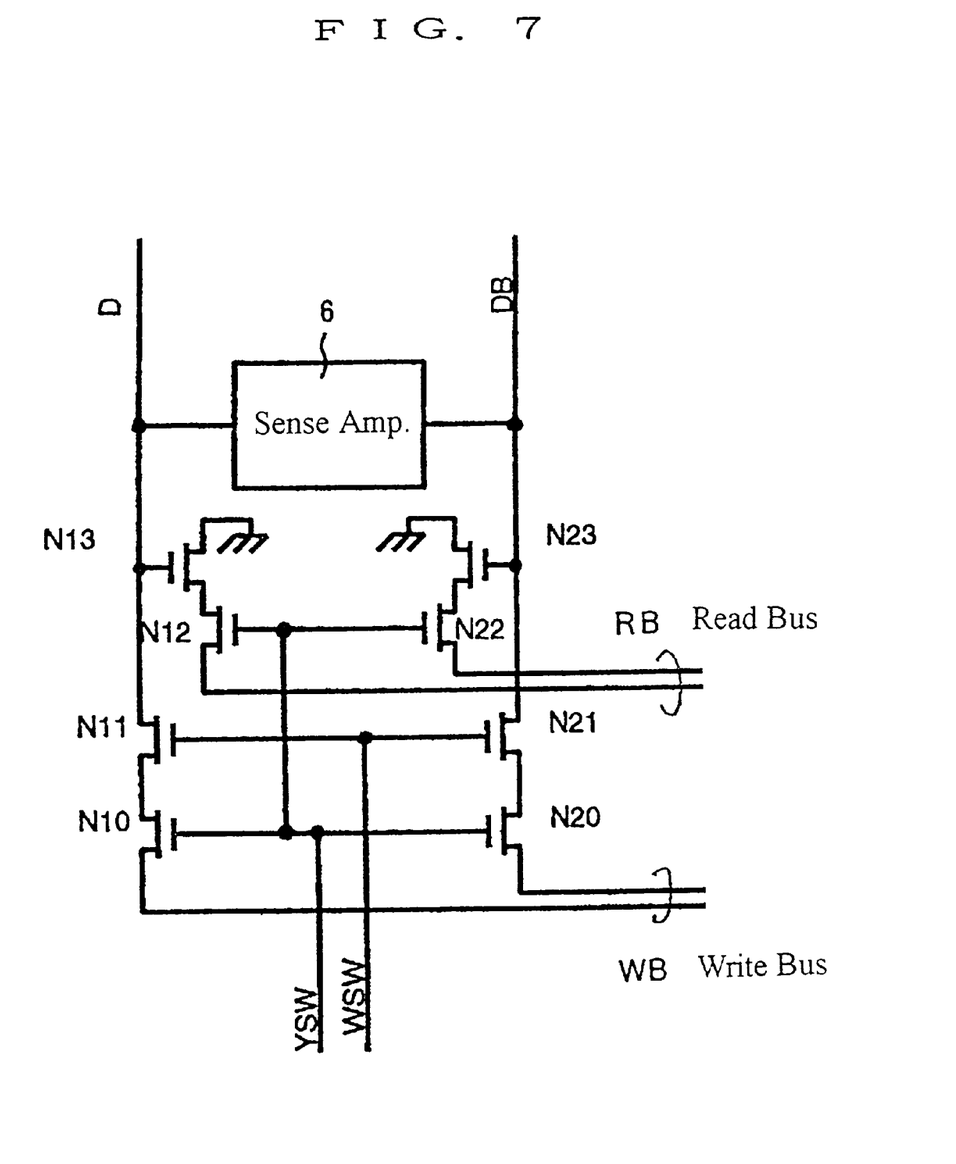
FIG. 7 is a circuit diagram of a circuit which separates the write data bus WB from the read data bus RB.

FIG. 7 illustrates a circuit which separates the write data bus WB and the read data bus RB. All transistors shown in FIG. 7 are, for example, N-channel MOS transistors. Data are outputted from memory-cell to one of paired bit lines D and DB. The data are amplified with the sensing amplifier 6. For reading, one of transistors N12 and N22 is selected by a column selecting signal (YSW). One of transistors N13 and N23 is selected as being connected to a high voltage one of the paired bit lines D and DB. The selected transistor is connected to the read data bus RB. The remaining transistor is connected to the ground line GND. For writing, transistors N10 and N20 are selected by a column selecting signal (YSW), and transistors N11 and N21 are selected by a write switch signal (WSW). Data are then fetched from the write data bus WB and written to the paired bit lines D and DB.

As mentioned above, in a synchronous semiconductor memory device according to the present invention, the second read-modify-write (RMW) cycle can start during the first RMW cycle so that the memory device has the following advantage. It is possible to decrease a RMW time in a continuous RMW operation. Namely, in the present embodiment, it is possible to set only the four cycles to continuous RMW operations so as to decrease two cycles in comparison with six cycles of the conventional device. Consequently, it is possible to increase the speed of the RMW operation.

Further, in a synchronous semiconductor memory device according to the present invention, it is possible to separate the write data bus and the read data bus only by adding some transistors.

Differently from the conventional device, the novel device needs no shift-register so as to reduce the chip-size and the manufacturing cost.

What is claimed is:

1. A synchronous semiconductor memory device capable of performing a read-modify-write cycle while connected to a single external data bus, comprising:

a sense-amplified storage cell section;

an amplified output buffer section having an input connected to the sense-amplified storage cell section by a read data bus, an output of the amplified output buffer section being connected to the external data bus; and an amplified input buffer section having an output connected to the sense-amplified storage cell section by a write data bus separate from the read data bus, an input of the amplified output buffer section being connected to the external data bus; and means for selectively switching the read data bus and the write data bus;

wherein data is transferable between the synchronous semiconductor memory device and all other devices with which it shares data by the external data bus.

2. The synchronous semiconductor memory device of claim 1, wherein the sense-amplified storage cell section comprises a memory cell and a sense amplifier.

3. The synchronous semiconductor memory device of claim 2, wherein the amplified output buffer section comprises a read amplifier and an output buffer, an output of the read amplifier being connected to an input of the output buffer, the sense amplifier being connected by the read data bus to an input of the read amplifier; and wherein the amplified input buffer section comprises a write amplifier and an input buffer, an output of the input buffer being connected to an input of the write amplifier, the sense amplifier being connected by the write data bus to an output of the write amplifier.

4. The synchronous semiconductor memory device of claim 2, wherein the selective switching means is capable of providing data read from the memory cell on the read data bus simultaneously with different data to be written to the memory cell being on the write data bus.

* * * * *